(12) United States Patent
Cheng

(10) Patent No.: US 11,646,707 B2
(45) Date of Patent: May 9, 2023

(54) ANALOG FRONT END WITH PULSE WIDTH MODULATION CURRENT COMPENSATION

(71) Applicant: NOVATEK MICROELECTRONICS CORP., Hsinchu (TW)

(72) Inventor: Yen-Cheng Cheng, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 248 days.

(21) Appl. No.: 17/183,310

(22) Filed: Feb. 23, 2021

(65) Prior Publication Data

US 2021/0365058 A1 Nov. 25, 2021

Related U.S. Application Data

(60) Provisional application No. 63/028,031, filed on May 21, 2020.

(51) Int. Cl.
*H03F 3/217* (2006.01)
*H03F 3/45* (2006.01)

(52) U.S. Cl.
CPC ... *H03F 3/45475* (2013.01); *H03F 2200/129* (2013.01)

(58) Field of Classification Search
CPC .................................. H03F 3/38; H03F 3/217
USPC ........................................ 330/10, 207 A, 251
See application file for complete search history.

(56) References Cited

U.S. PATENT DOCUMENTS 6,577,186 B2 * 6/2003 Berkhout ................. H03F 3/217
330/10
7,965,141 B2 * 6/2011 Dooper ................... H03F 3/217
330/10

\* cited by examiner

*Primary Examiner* — Henry Choe
(74) *Attorney, Agent, or Firm* — JCIPRNET

(57) ABSTRACT

An analog front end circuit with pulse width modulation current compensation comprises sensing a current condition and determining if the current condition is a positive or negative current condition. An appropriate control signal is determined according to the current condition and sent to turn on a positive current electronic switch if the current condition is a negative current condition or sent to turn on a negative current electronic switch if the current condition is a positive current condition. A positive compensation current flows to offset negative parasitic current when the positive current electronic switch is turned on and a negative compensation current flows to offset positive parasitic current when the negative current electronic switch is turned on. A master control unit utilizes pulse width modulation signals of various widths associated with various current conditions to be sent to turn on the positive electronic switch or the negative electronic switch.

24 Claims, 8 Drawing Sheets

ANALOG FRONT END WITH PULSE WIDTH MODULATION CURRENT COMPENSATION

CROSS-REFERENCE TO RELATED APPLICATION

This non-provisional application claims priority under 35 U.S.C. § 119(e) on U.S. provisional Patent Application No. 63/028,031 filed on May 21, 2020, the entire contents of which are hereby incorporated by reference.

BACKGROUND OF THE INVENTION

1. Field of the Invention

The present disclosure relates to an analog front end (AFE), and in particular to an analog front end circuit with pulse width modulation current compensation.

2. Description of the Related Art

Refer to FIG. 1, which is a drawing illustrating an analog front end detection circuit 10. When T[n] receives a sensing signal source, it converts the signal into a current $I_{sense}$ and stores it in the integrator 20. Unfortunately, there are many parasitic capacitances on the detection path, which makes the detection current change from $I_{sense}$ to $I_{sense}+I_{other}$. In order to offset $I_{other}$'s excess current, the prior art adds a capacitor compensation circuit $C_{comp}$. The compensation current $I_{comp}$ is generated through the toggling of the compensation voltage high ($V_{comph}$) and compensation voltage low ($V_{compl}$) voltage.

This results in a large compensation capacitor value which makes the layout area have a wide range of capacitances and negatively affects circuit performance.

Therefore, to overcome the disadvantages of the prior art, there is need for an analog front end circuit with pulse width modulation current compensation that has compensation currents in both the positive and negative directions.

BRIEF SUMMARY OF THE INVENTION

An objective of the present disclosure is to provide a current compensation circuit for an analog front end (AFE) that utilizes a pulse width modulation (PWM) signal to generate a positive compensation current and a negative compensation current.

When a $V_{TX}$ signal goes from low to high, a positive current is sensed by an integrator. At this time the $I_{other}$ current is sensed to be greater than zero (>0), so the negative compensation current is turned on and only $I_{sense}$ flows into the integrator.

When a $V_{TX}$ signal goes from high to low, a negative current is sensed by the integrator. At this time the $I_{other}$ current is sensed to be less than zero (<0), so the positive compensation current is turned on and only $I_{sense}$ flows into the integrator.

As a result, the present invention eliminates the negative effects of parasitic capacitances on the detection path, by using negative compensation current and positive compensation current to offset $I_{other}$'s excess current so that only $I_{sense}$ flows into the integrator.

The present invention provides a current compensation circuit for an analog front end that comprises a positive current electronic switch, the positive current electronic switch connected between a positive voltage supply and a current path; and a negative current electronic switch, the negative current electronic switch connected between ground and the current path.

In an embodiment, depending upon a sensed current condition, the positive current electronic switch or the negative current electronic switch is turned on. When the positive current electronic switch is turned on, a positive compensation current flows. When the negative current electronic switch is turned on, a negative compensation current flows. In an embodiment, a pulse width modulation signal turns on the positive current electronic switch or the negative current electronic switch.

In an embodiment, the current compensation circuit for an analog front end further comprises a master control unit, the master control unit sends pulse width modulation signal widths according to positive and negative current compensation conditions. The master control unit comprises a register table containing pulse width modulation signal widths according to positive current compensation conditions and negative current compensation conditions. Depending upon the sensed current condition, the master control unit sends an appropriate pulse width modulation signal to turn on the positive current electronic switch (pwm-p signal) or the negative current electronic switch (pwm-n signal). In an embodiment, the positive compensation current offsets negative parasitic current and the negative compensation current offsets positive parasitic current.

The present invention also provides a current compensation circuit for an analog front end that comprises a first operational amplifier, the first operational amplifier comprising a first negative input; a first positive input, the first positive input receiving an input voltage signal; and a first output, the first output electrically connected to the first negative input. The current compensation circuit further comprises a second operational amplifier, the second operational amplifier comprising a second negative input, the second negative input receiving a reference voltage signal; a second positive input; and a second output. A first capacitor is connected between the second negative input and the second output of the second operational amplifier; a second capacitor is connected between the second positive input and the second output of the second operational amplifier. The current compensation circuit further comprises a positive current electronic switch, the positive current electronic switch is connected between a positive voltage supply and the second positive input of the second operational amplifier; and a negative current electronic switch, the negative current electronic switch is connected between ground and the second positive input of the second operational amplifier. In an embodiment, the positive current electronic switch is turned on by a pulse width modulation signal. In an embodiment, the negative current electronic switch is turned on by a pulse width modulation signal.

In an embodiment, the current compensation circuit for an analog front end further comprises a master control unit, the master control unit sends pulse width modulation signal widths according to positive and negative current compensation conditions. The master control unit comprises a register table containing pulse width modulation signal widths according to positive current compensation conditions and negative current compensation conditions. Depending upon a sensed condition, the master control unit sends an appropriate pulse width modulation signal (pwm-p signal or pwm-n signal) to turn on the positive current electronic switch (pwm-p signal) or the negative current electronic switch (pwm-n signal). When the positive current electronic switch is turned on, a positive compensation current flows from the positive voltage supply to the second positive input. The positive compensation current offsets a negative parasitic current. When the negative current electronic switch is turned on, a negative compensation current flows from the second positive input to ground. The negative compensation current offsets a positive parasitic current.

In an embodiment, the current compensation circuit for an analog front end is integrated in an integrated circuit.

The present invention also provides a method of current compensation in an analog front end circuit that comprises sensing a current condition in the analog front end circuit; determining an appropriate signal according to the current condition; sending the appropriate signal to turn on an electronic switch; and allowing a compensation current to flow to offset parasitic current. If the current condition indicates the parasitic current is less than zero, the appropriate signal is sent to turn on the electronic switch to allow a positive compensation current to flow. If the current condition indicates the parasitic current is greater than zero, the appropriate signal is sent to turn on the electronic switch to allow a negative compensation current to flow. In an embodiment, a master control unit determines the current condition and utilizes pulse width modulation signals of various widths to be sent to turn on the positive electronic switch or the negative electronic switch. The master control unit determines the current condition and utilizes a register table with various pulse width modulation widths to determine the appropriate signal to send.

The present invention also provides a method of current compensation in an analog front end circuit that comprises sensing a current condition in the analog front end circuit; determining if the current condition is a positive or negative current condition; determining an appropriate control signal according to the current condition; sending the appropriate control signal to turn on a positive current electronic switch if the current condition is a negative current condition; sending the appropriate control signal to turn on a negative current electronic switch if the current condition is a positive current condition; allowing a positive compensation current to flow to offset negative parasitic current when the positive current electronic switch is turned on; and allowing a negative compensation current to flow to offset positive parasitic current when the negative current electronic switch is turned on. In an embodiment, a master control unit determines the current condition and utilizes pulse width modulation signals of various widths to be sent to turn on the positive electronic switch or the negative electronic switch. The master control unit utilizes a register table with various pulse width modulation widths to determine the appropriate control signal to send.

DETAILED DESCRIPTION OF THE INVENTION

To facilitate understanding of the object, characteristics and effects of this present disclosure, embodiments together with the attached drawings for the detailed description of the present disclosure are provided.

Figure 1:
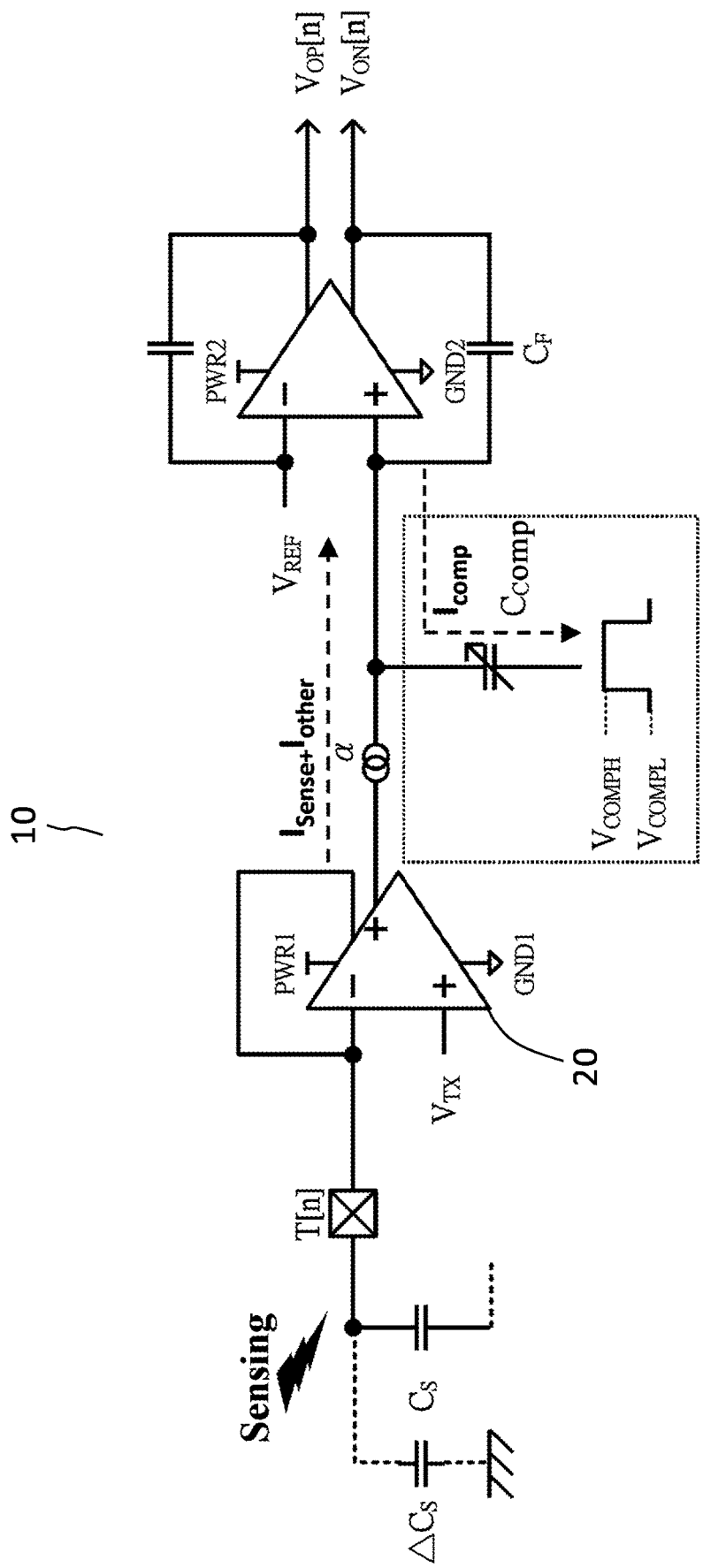
FIG. 1 is a drawing illustrating an analog front end detection circuit of the prior art.
Figure 2A:
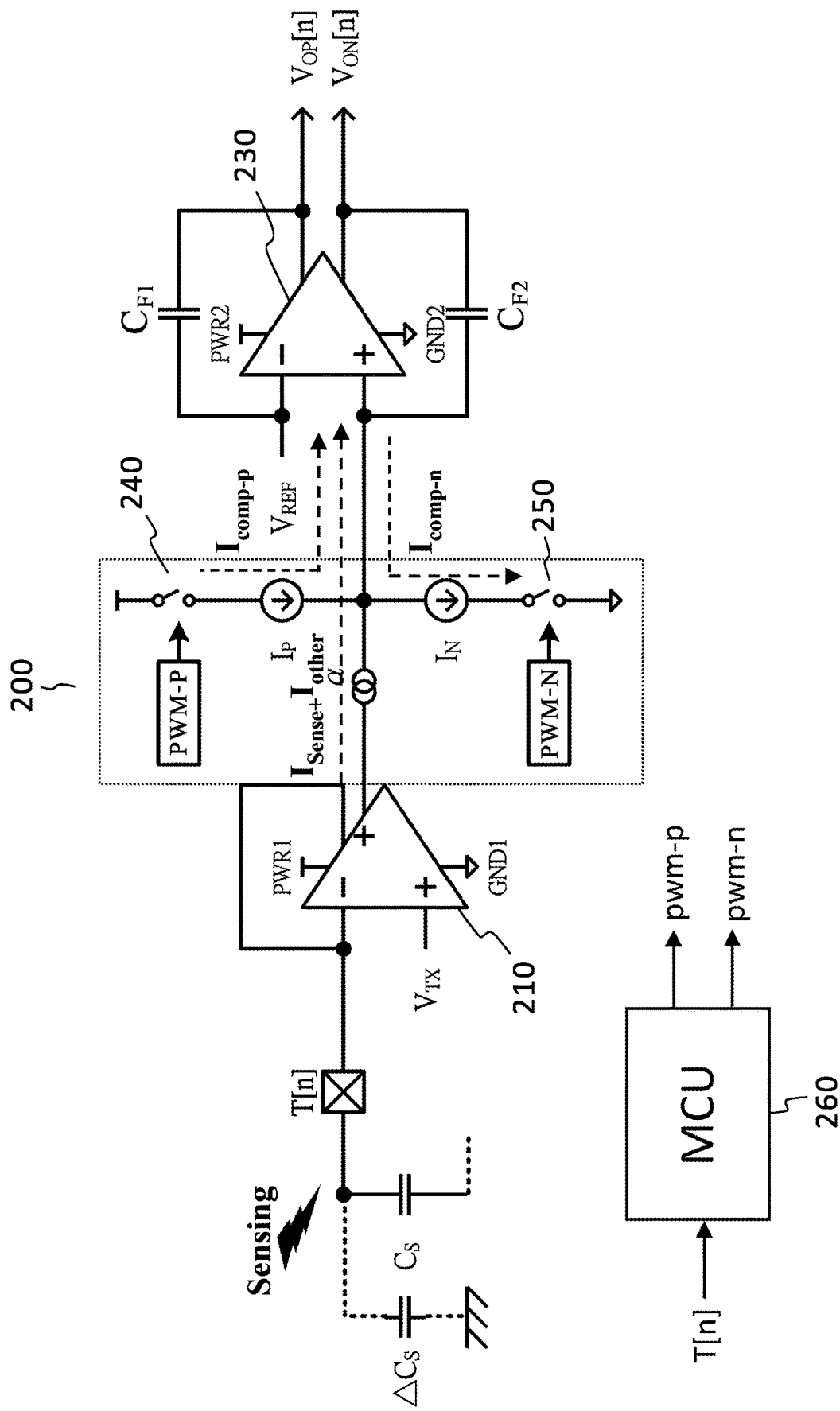
FIG. 2A is a drawing illustrating an analog front end with pulse width modulation current compensation circuit according to an embodiment of the present invention.

Refer to FIG. 2A, which is a drawing illustrating an analog front end with pulse width modulation current compensation circuit according to an embodiment of the present invention.

The analog front end with pulse width modulation current compensation circuit 200 comprises a first operational amplifier 210, a second operational amplifier 230, a positive current electronic switch 240, and a negative current electronic switch 250. The first operational amplifier 210 and the second operational amplifier 230 function as integrators.

The first operational amplifier 210 comprises a first negative input, and a first positive input, the first positive input receiving an input voltage signal $V_{TX}$. The first operational amplifier 210 further comprises a first positive output electrically connected to the first negative input.

The second operational amplifier 230 comprises a second negative input, the second negative input receiving a reference voltage signal $V_{ref}$. The second operational amplifier 230 further comprises a second positive input, a second positive output, and a second negative output. A first feedback capacitor $C_{F1}$ is connected between the second negative input and the second positive output. The second positive output is for outputting a positive output voltage signal ($V_{OP[n]}$). A second feedback capacitor $C_{F2}$ is connected between the second positive input and the second negative output. The second negative output is for outputting a negative output voltage signal ($V_{ON[n]}$).

The first positive output of the first operational amplifier 210 is electrically connected to the second positive input of the second operational amplifier 230.

The positive current electronic switch 240 is connected between a positive voltage supply and the second positive input.

The negative current electronic switch 250 is connected between ground and the second positive input.

A pulse width modulation signal turns on the positive current electronic switch 240 or the negative current electronic switch 250. A pulse width modulation positive signal (pwm-p signal) turns on the positive current electronic switch 240. A pulse width modulation negative signal (pwm-n signal) turns on the negative current electronic switch 250.

When the positive current electronic switch 240 is turned on, a positive compensation current ($I_{comp-p}$) flows from the positive voltage supply to the second positive input. The positive compensation current ($I_{comp-p}$) offsets a negative parasitic current.

When the negative current electronic switch 250 is turned on, a negative compensation current ($I_{comp-n}$) flows from the second positive input to ground. The negative compensation current ($I_{comp-n}$) offsets a positive parasitic current.

When T[n] receives a sensing signal source, it converts the signal into a current $I_{sense}$ and loads it in the first operational amplifier 210. Unfortunately, there are many parasitic capacitances on the detection path, which makes the detection current change from $I_{sense}$ to $I_{sense}+I_{other}$. In order to offset $I_{other}$'s excess current, the analog front end with pulse width modulation current compensation circuit utilizes a pulse width modulation (PWM) signal to generate a positive compensation current and a negative compensation current.

Figure 2B:
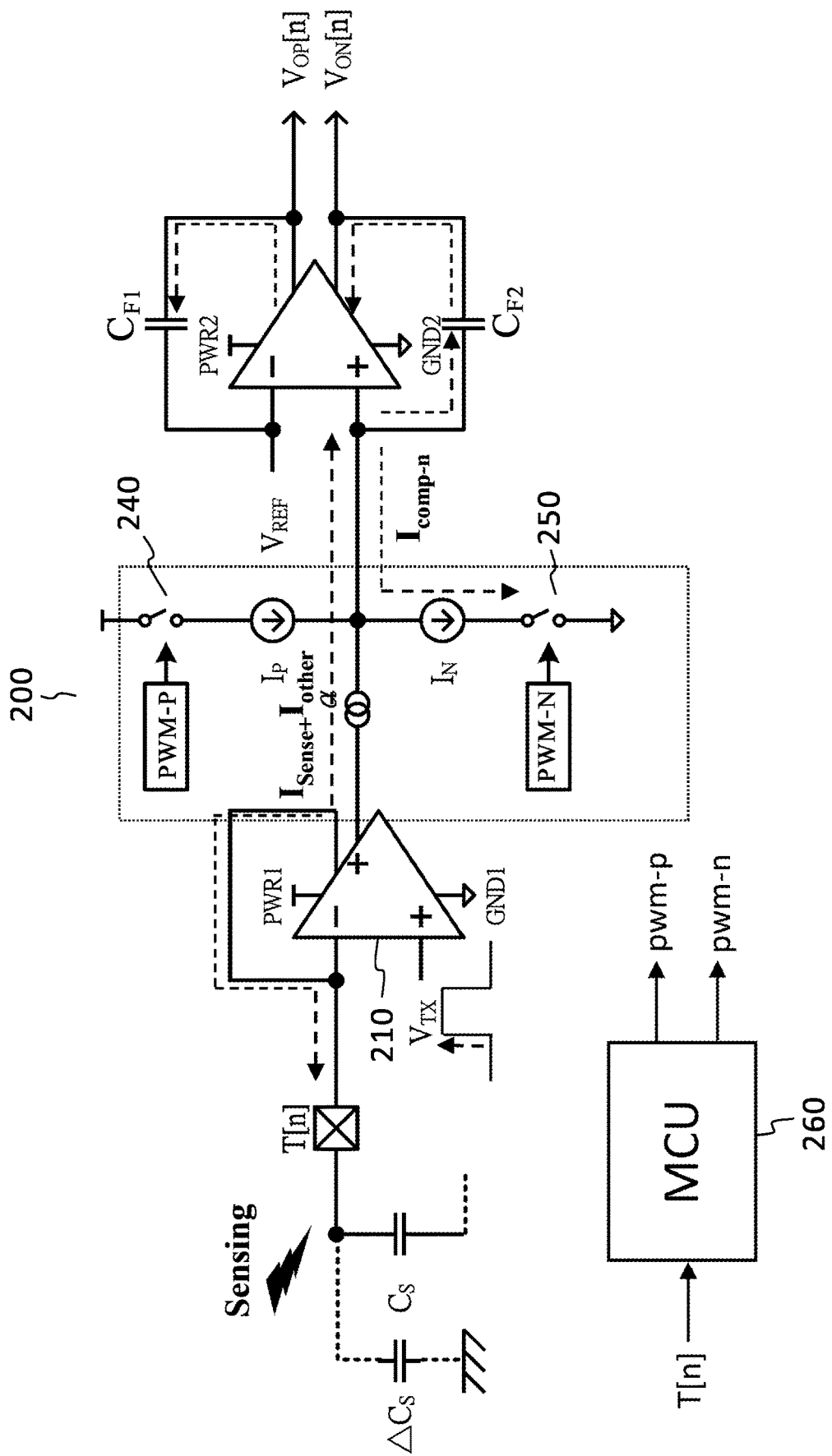
FIG. 2B is a drawing illustrating an analog front end with pulse width modulation negative current compensation circuit according to an embodiment of the present invention.

Refer to FIG. 2B, which is a drawing illustrating an analog front end with pulse width modulation negative current compensation circuit according to an embodiment of the present invention.

When the $V_{TX}$ signal (at the first positive input of the first operational amplifier 210) goes from low to high, a positive current is sensed by the first operational amplifier 210. At this time the $I_{other}$ current is sensed to be greater than zero (>0), so the negative electronic switch 250 is turned on and the negative compensation current $I_{comp-n}$ flows from the second positive input of the second operational amplifier 230, through the negative electronic switch 250 to ground.

As a result, the present invention eliminates the negative effects of parasitic capacitances on the detection path, by utilizing the negative compensation current $I_{comp-n}$ to offset the $I_{other}$ excess current and only $I_{sense}$ flows into the second operational amplifier 230.

Figure 2C:
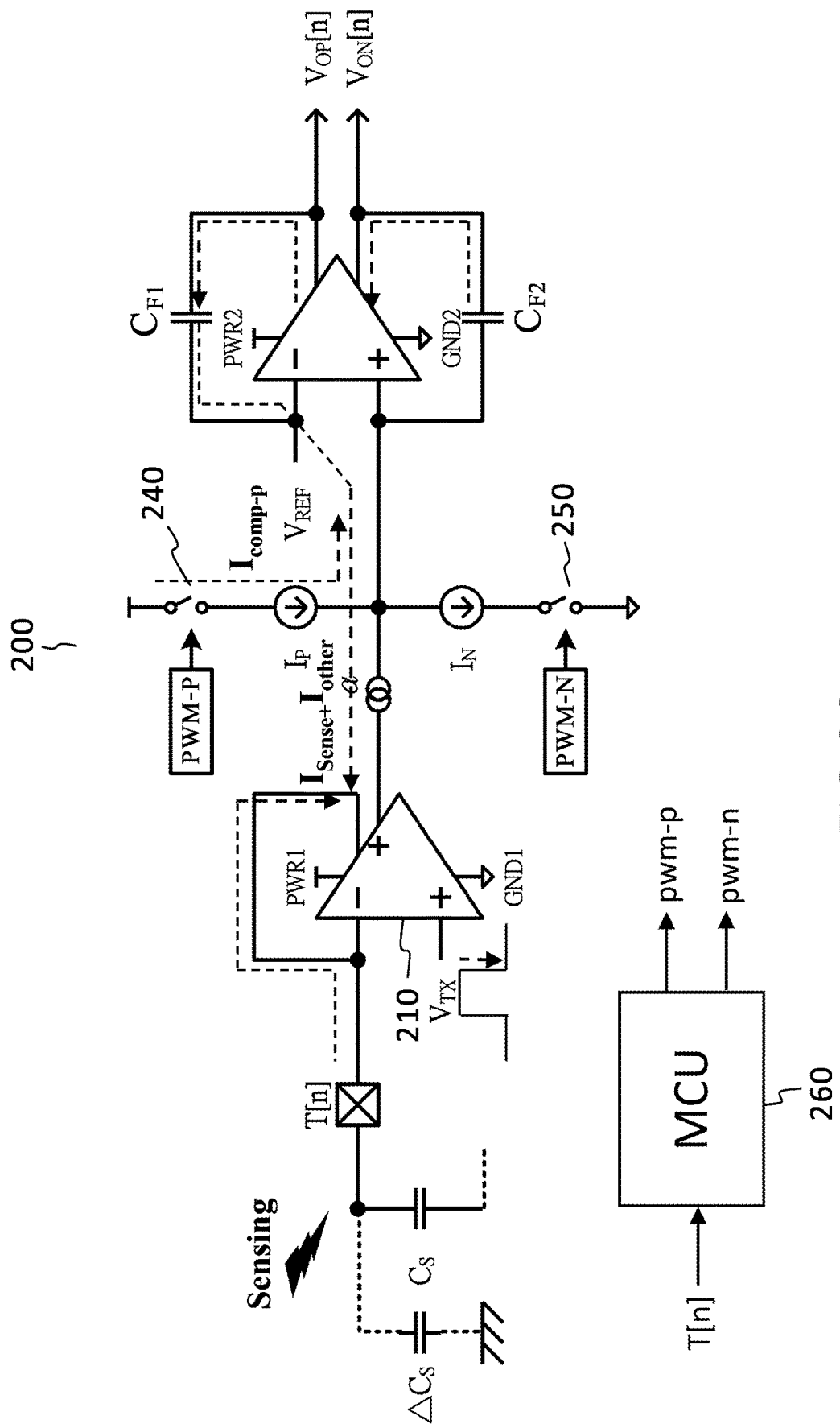
FIG. 2C is a drawing illustrating an analog front end with pulse width modulation positive current compensation circuit according to an embodiment of the present invention.

Refer to FIG. 2C, which is a drawing illustrating an analog front end with pulse width modulation positive current compensation circuit according to an embodiment of the present invention.

When the $V_{TX}$ signal (at the first positive input of the first operational amplifier 210) goes from high to low, a negative current is sensed by the first operational amplifier 210. At this time the $I_{other}$ current is sensed to be less than zero (<0), so the positive electronic switch 240 is turned on and the positive compensation current $I_{comp-p}$ flows from the positive voltage supply through the positive electronic switch 240 to the second positive input of the second operational amplifier 230.

As a result, the present invention eliminates the negative effects of parasitic capacitances on the detection path, by utilizing the positive compensation current $I_{comp-p}$ to offset the $I_{other}$ excess current and only $I_{sense}$ flows into the second operational amplifier 230.

Figure 3:
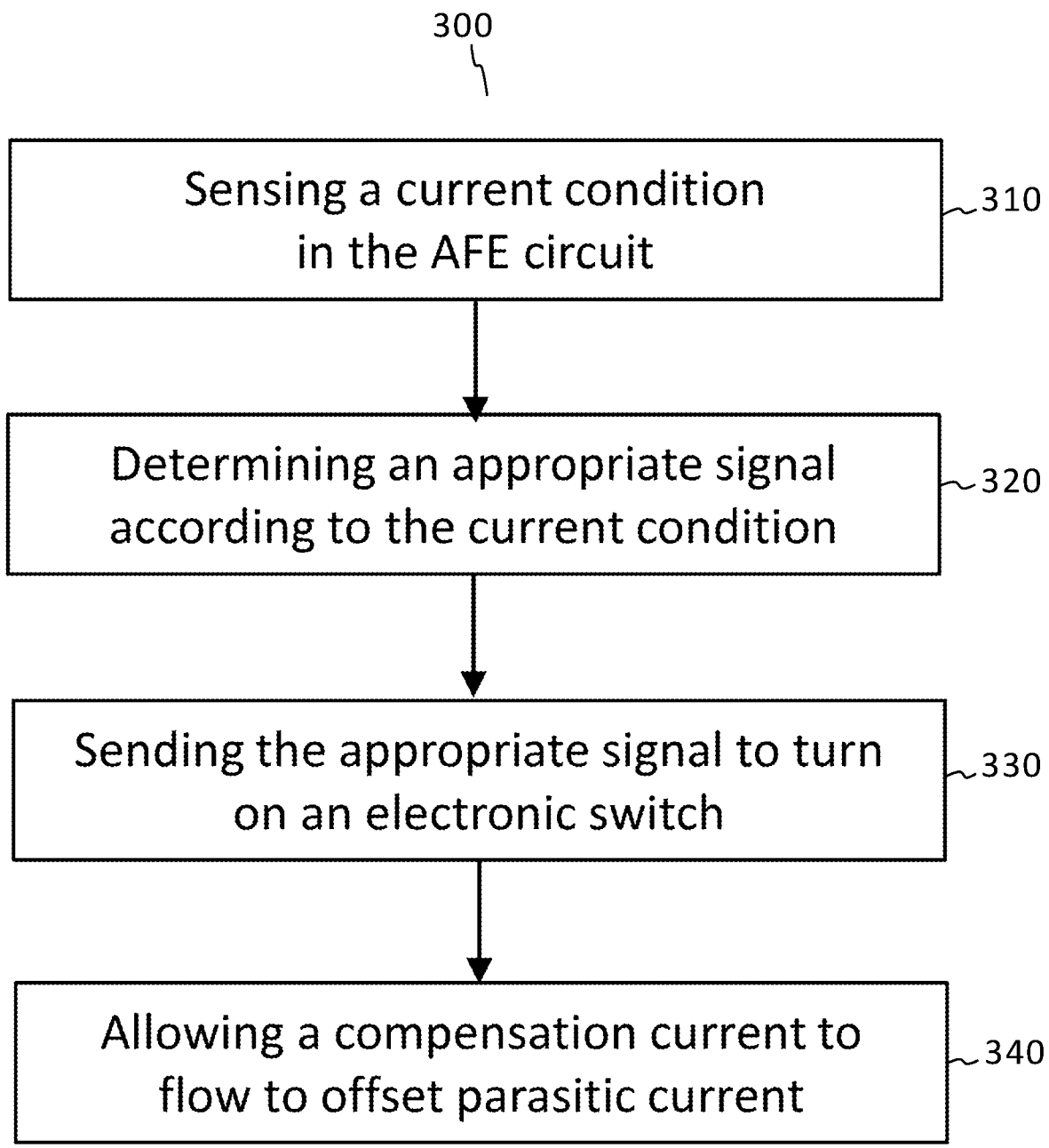
FIG. 3 is a flowchart illustrating a method of current compensation in an analog front end circuit according to an embodiment of the present invention.

Refer to FIG. 3, which is a flowchart illustrating a method of current compensation in an analog front end circuit according to an embodiment of the present invention.

In an embodiment, the present invention also provides a current compensation method 300 in an analog front end circuit that comprises sensing a current condition in the analog front end circuit in Step 310. In Step 320, an appropriate signal is determined according to the sensed current condition. The appropriate signal is sent to turn on an electronic switch in Step 330. In Step 340 a compensation current is allowed to flow to offset any parasitic current. If the current condition in Step 310 indicates the parasitic current is less than zero, the appropriate signal (pwm-p signal) is sent to turn on the positive electronic switch to allow a positive compensation current to flow. If the current condition in Step 310 indicates the parasitic current is greater than zero, the appropriate signal (pwm-n signal) is sent to turn on the negative electronic switch to allow a negative compensation current to flow. In an embodiment, refer to FIGS. 2A, 2B and 2C, a master control unit (MCU) 260 determines the current condition and utilizes pulse width modulation signals of various widths to send to turn on the positive electronic switch or the negative electronic switch. The master control unit utilizes a register table with various pulse width modulation widths associated with various current conditions in order to determine the appropriate control signal to send.

Figure 4:
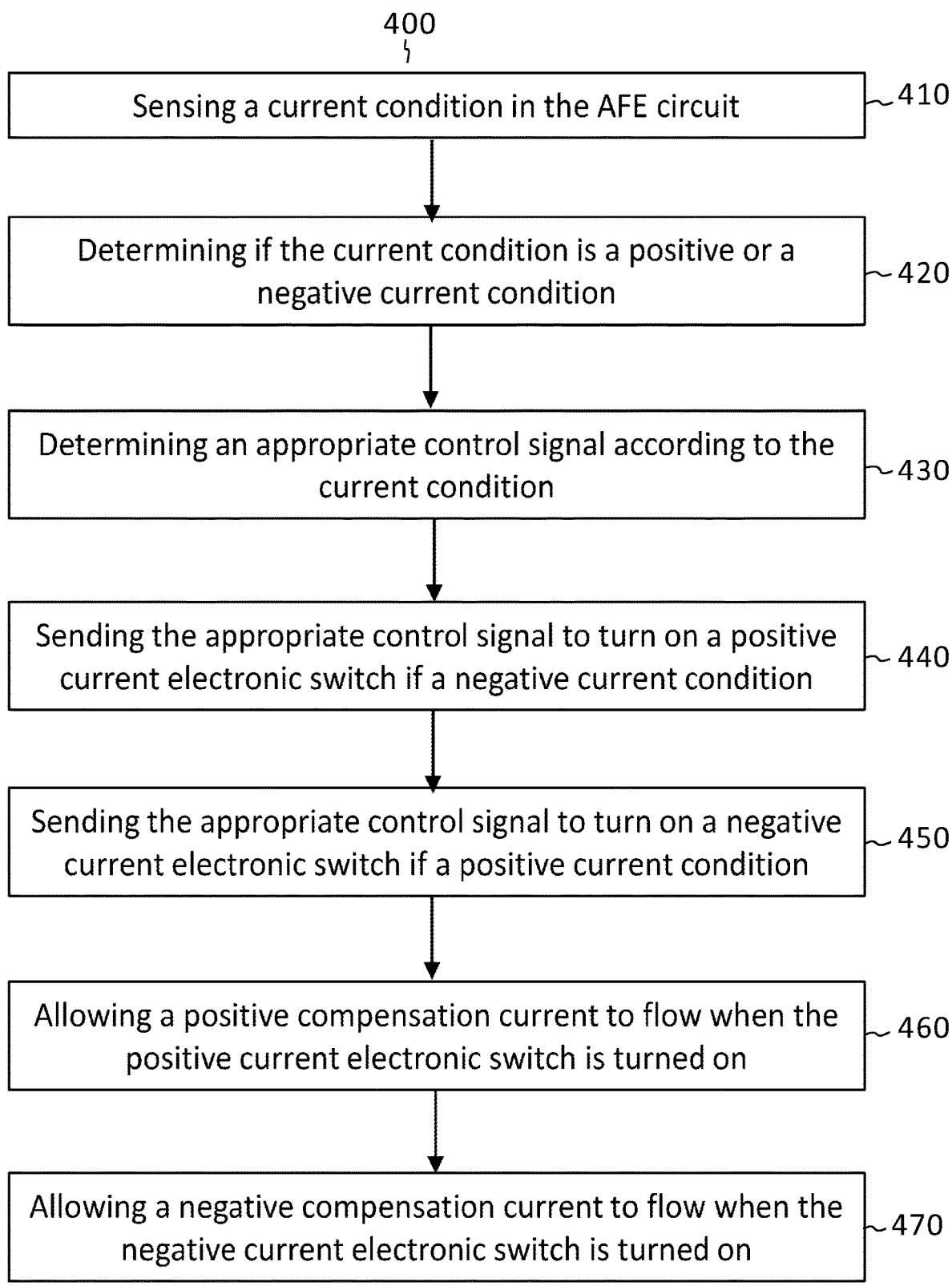
FIG. 4 is a flowchart illustrating a method of current compensation in an analog front end circuit according to an embodiment of the present invention.

Refer to FIG. 4, which is a flowchart illustrating a method of current compensation in an analog front end circuit according to an embodiment of the present invention.

The present invention also provides a current compensation method 400 in an analog front end circuit that comprises sensing a current condition in the analog front end circuit in Step 410. In Step 420, determine if the current condition is a positive current condition or a negative current condition. Then, an appropriate control signal is determined according to the sensed current condition in Step 430. In Step 440, the appropriate control signal is sent to turn on a positive current electronic switch if the current condition is a negative current condition. The appropriate control signal is sent to turn on a negative current electronic switch if the current condition is a positive current condition in Step 450. In Step 460, a positive compensation current is allowed to flow to offset negative parasitic current when the positive current electronic switch is turned on. A negative compensation current is allowed to flow to offset positive parasitic current when the negative current electronic switch is turned on in Step 470.

In an embodiment, a master control unit determines the current condition and utilizes pulse width modulation signals of various widths to be sent to turn on the positive electronic switch or the negative electronic switch. The master control unit utilizes a register table with various pulse width modulation widths associated with various current conditions to determine the appropriate control signal to send.

Figure 5:
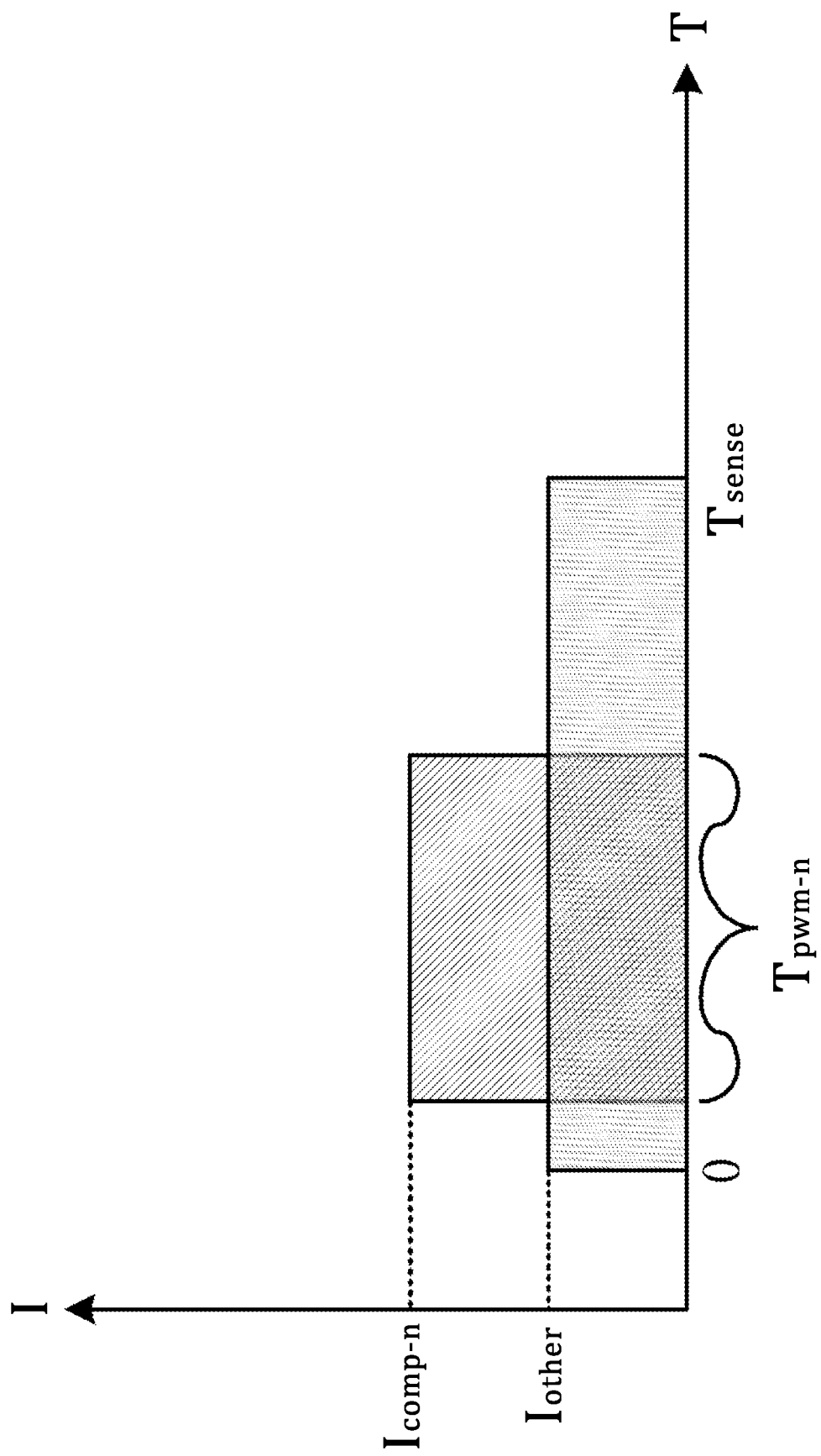
FIG. 5 is a timing diagram illustrating a negative current compensation signal according to an embodiment of the present invention.

Refer to FIG. 5, which is a timing diagram illustrating a negative current compensation signal according to an embodiment of the present invention.

As shown in FIG. 5, when $I_{other}$ is greater than zero ($I_{other}>0$), the master control unit sends a pulse width modulation signal (pwm-n) to turn on the negative current electronic switch and the compensation current $I_{comp-n}$ is enabled for compensation. $I_{other}*T_{sense}-I_{comp-n}*T_{pwm-n}=0$.

Figure 6:
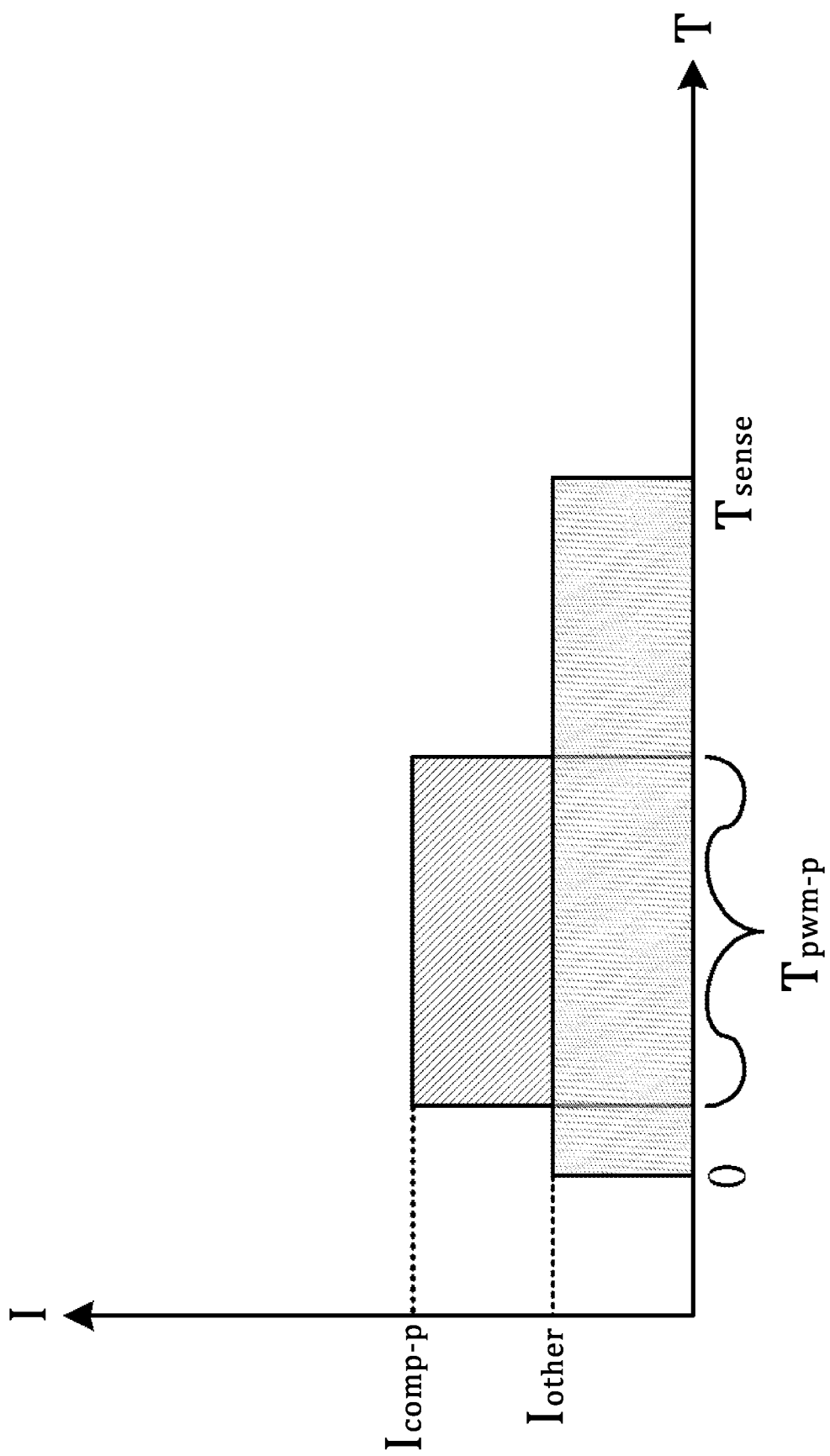
FIG. 6 is a timing diagram illustrating a positive current compensation signal according to an embodiment of the present invention.

Refer to FIG. 6, which is a timing diagram illustrating a positive current compensation signal according to an embodiment of the present invention.

As shown in FIG. 6, when $I_{other}$ is less than zero ($I_{other}<0$), the master control unit sends a pulse width modulation signal (pwm-p) to turn on the positive current electronic switch and the compensation current $I_{comp-p}$ is enabled for compensation. $I_{other}*T_{sense}+I_{comp-p}*T_{pwm-p}=0$.

While the present disclosure has been described by means of specific embodiments, numerous modifications and variations could be made thereto by those skilled in the art without departing from the scope and spirit of the present disclosure set forth in the claims.

What is claimed is:

1. A current compensation circuit for an analog front end comprising:
   a positive current electronic switch, the positive current electronic switch connected between a positive voltage supply and a current path; and
   a negative current electronic switch, the negative current electronic switch connected between ground and the current path;

wherein depending upon a sensed current condition, the positive current electronic switch or the negative current electronic switch is turned on;

wherein if the sensed current condition indicates that a parasitic current is less than zero, the positive current electronic switch is turned on and allow a positive compensation current to flow.

2. The current compensation circuit for an analog front end of claim 1, wherein a pulse width modulation signal turns on the positive current electronic switch or the negative current electronic switch.

3. The current compensation circuit for an analog front end of claim 1, further comprising:
a master control unit, the master control unit comprising a register table containing pulse width modulation signal widths according to positive and negative current compensation conditions;
wherein, depending upon the sensed current condition, the master control unit sends an appropriate pulse width modulation signal to turn on the positive current electronic switch or the negative current electronic switch.

4. The current compensation circuit for an analog front end of claim 1, wherein the positive compensation current offsets negative parasitic current.

5. The current compensation circuit for an analog front end of claim 1, wherein the negative compensation current offsets positive parasitic current.

6. A current compensation circuit for an analog front end comprising:
a first operational amplifier, the first operational amplifier comprising:
a first negative input;
a first positive input, the first positive input receiving an input voltage signal; and
a first output, the first output electrically connected to the first negative input;
a second operational amplifier, the second operational amplifier comprising:
a second negative input, the second negative input receiving a reference voltage signal;
a second positive input; and
a second output;
a first capacitor connected between the second negative input and the second output;
a second capacitor connected between the second positive input and the second output;
a positive current electronic switch, the positive current electronic switch connected between a positive voltage supply and the second positive input; and
a negative current electronic switch, the negative current electronic switch connected between ground and the second positive input.

7. The current compensation circuit for an analog front end of claim 6, wherein the positive current electronic switch is turned on by a pulse width modulation signal.

8. The current compensation circuit for an analog front end of claim 6, wherein the negative current electronic switch is turned on by a pulse width modulation signal.

9. The current compensation circuit for an analog front end of claim 6, further comprising:
a master control unit, the master control unit comprising a register table containing pulse width modulation signal widths according to positive and negative current compensation conditions;
wherein, depending upon a sensed condition, the master control unit sends an appropriate pulse width modulation signal to turn on the positive current electronic switch or the negative current electronic switch.

10. The current compensation circuit for an analog front end of claim 6, wherein when the positive current electronic switch is turned on, a positive compensation current flows from the positive voltage supply to the second positive input.

11. The current compensation circuit for an analog front end of claim 10, wherein the positive compensation current offsets a negative parasitic current.

12. The current compensation circuit for an analog front end of claim 6, wherein when the negative current electronic switch is turned on, a negative compensation current flows from the second positive input to ground.

13. The current compensation circuit for an analog front end of claim 12, wherein the negative compensation current offsets a positive parasitic current.

14. A method of current compensation in an analog front end circuit comprising:
sensing a current condition in the analog front end circuit;
determining an appropriate signal according to the current condition;
sending the appropriate signal to turn on an electronic switch; and
allowing a compensation current to flow to offset parasitic current,
wherein if the current condition indicates that the parasitic current is less than zero, the appropriate signal is sent to turn on the electronic switch to allow a positive compensation current to flow.

15. The method of current compensation in an analog front end circuit of claim 14, wherein if the current condition indicates the parasitic current is greater than zero, the appropriate signal is sent to turn on the electronic switch to allow a negative compensation current to flow.

16. The method of current compensation in an analog front end circuit of claim 14, wherein a master control unit determines the current condition and utilizes a register table with various pulse width modulation widths to determine the appropriate signal to send.

17. A method of current compensation in an analog front end circuit comprising:
sensing a current condition in the analog front end circuit;
determining if the current condition is a positive or negative current condition;
determining an appropriate control signal according to the current condition;
sending the appropriate control signal to turn on a positive current electronic switch if the current condition indicates that a parasitic current is less than zero;
sending the appropriate control signal to turn on a negative current electronic switch if the current condition indicates that the parasitic current is greater than zero;
allowing a positive compensation current to flow to offset the parasitic current that is less than zero when the positive current electronic switch is turned on; and
allowing a negative compensation current to flow to offset the parasitic current that is greater than zero when the negative current electronic switch is turned on.

18. The method of current compensation in an analog front end circuit of claim 17, wherein a master control unit determines the current condition and utilizes a register table with various pulse width modulation widths to determine the appropriate control signal to send.

19. A current compensation circuit for an analog front end comprising:

a first operational amplifier, the first operational amplifier comprising:
  a first negative input;
  a first positive input, the first positive input receiving an input voltage signal; and
  a first output, the first output electrically connected to the first negative input;
a second operational amplifier, the second operational amplifier comprising:
  a second negative input, the second negative input receiving a reference voltage signal;
  a second positive input; and
  a second output;
a positive current electronic switch, the positive current electronic switch connected between a positive voltage supply and the second positive input;
a negative current electronic switch, the negative current electronic switch connected between ground and the second positive input; and
a master control unit, the master control unit comprising a register table containing pulse width modulation signal widths according to positive and negative current compensation conditions;
  wherein, depending upon a sensed condition, the master control unit sends an appropriate pulse width modulation signal to turn on the positive current electronic switch or the negative current electronic switch.

20. The current compensation circuit for an analog front end of claim 19, further comprising:
  a first capacitor connected between the second negative input and the second output; and
  a second capacitor connected between the second positive input and the second output.

21. The current compensation circuit for an analog front end of claim 19, wherein when the positive current electronic switch is turned on, a positive compensation current flows from the positive voltage supply to the second positive input.

22. The current compensation circuit for an analog front end of claim 21, wherein the positive compensation current offsets a negative parasitic current.

23. The current compensation circuit for an analog front end of claim 19, wherein when the negative current electronic switch is turned on, a negative compensation current flows from the second positive input to ground.

24. The current compensation circuit for an analog front end of claim 23, wherein the negative compensation current offsets a positive parasitic current.

* * * * *